United States Patent
Lentine et al.

(10) Patent No.: US 9,093,586 B2
(45) Date of Patent: Jul. 28, 2015

(54) PHOTOVOLTAIC POWER GENERATION SYSTEM FREE OF BYPASS DIODES

(75) Inventors: Anthony L. Lentine, Albuquerque, NM (US); Murat Okandan, Edgewood, NM (US); Gregory N. Nielson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 565 days.

(21) Appl. No.: 13/543,297

(22) Filed: Jul. 6, 2012

(65) Prior Publication Data

US 2013/0269747 A1    Oct. 17, 2013

Related U.S. Application Data

(63) Continuation-in-part of application No. 13/164,483, filed on Jun. 20, 2011, now Pat. No. 8,736,108, which is a continuation-in-part of application No. 12/914,441, filed on Oct. 28, 2010, now Pat. No. 9,029,681, which is a continuation-in-part of application No. 11/933,458, filed on Nov. 1, 2007, application No. 13/543,297, which is a continuation-in-part of application No. 12/957,082, filed on Nov. 30, 2010, now Pat. No. 8,329,503, which is a continuation-in-part of application No. 11/933,458, filed on Nov. 1, 2007.

(51) Int. Cl.
*H01L 31/05* (2014.01)
*H02J 1/10* (2006.01)

(52) U.S. Cl.
CPC ............. *H01L 31/0504* (2013.01); *Y02E 10/50* (2013.01)

(58) Field of Classification Search
USPC .......................................................... 307/43
See application file for complete search history.

(56) References Cited

U.S. PATENT DOCUMENTS

| | | | |
|---|---|---|---|
| 7,932,462 B2 | 4/2011 | Van Riesen et al. | |
| 8,067,295 B2 | 11/2011 | Yagiura et al. | |
| 8,093,492 B2 | 1/2012 | Hering et al. | |
| 2004/0187912 A1* | 9/2004 | Takamoto et al. | 136/255 |
| 2007/0227579 A1 | 10/2007 | Buller et al. | |
| 2008/0099063 A1 | 5/2008 | Armstrong et al. | |

(Continued)

FOREIGN PATENT DOCUMENTS

WO    WO 2010081746 A2    7/2010

OTHER PUBLICATIONS

International Search Report mailed Feb. 11, 2014 for PCT/US2013/049165.

*Primary Examiner* — Robert Deberadinis
(74) *Attorney, Agent, or Firm* — Martin I. Finston

(57) ABSTRACT

A photovoltaic power generation system that includes a solar panel that is free of bypass diodes is described herein. The solar panel includes a plurality of photovoltaic sub-modules, wherein at least two of photovoltaic sub-modules in the plurality of photovoltaic sub-modules are electrically connected in parallel. A photovoltaic sub-module includes a plurality of groups of electrically connected photovoltaic cells, wherein at least two of the groups are electrically connected in series. A photovoltaic group includes a plurality of strings of photovoltaic cells, wherein a string of photovoltaic cells comprises a plurality of photovoltaic cells electrically connected in series. The strings of photovoltaic cells are electrically connected in parallel, and the photovoltaic cells are microsystem-enabled photovoltaic cells.

16 Claims, 6 Drawing Sheets

(56) References Cited

U.S. PATENT DOCUMENTS

| | | | |
|---|---|---|---|
| 2009/0217965 A1* | 9/2009 | Dougal et al. | 136/244 |
| 2011/0073150 A1 | 3/2011 | Hightower et al. | |
| 2011/0209758 A1 | 9/2011 | Duesterhoeft et al. | |
| 2011/0308565 A1 | 12/2011 | Takayama et al. | |
| 2012/0006483 A1 | 1/2012 | Hanoka et al. | |
| 2012/0031468 A1 | 2/2012 | Boise et al. | |
| 2012/0060890 A1 | 3/2012 | Park et al. | |
| 2012/0103388 A1 | 5/2012 | Meakin et al. | |
| 2012/0118358 A1 | 5/2012 | Song | |
| 2012/0122262 A1 | 5/2012 | Kang et al. | |

* cited by examiner

PHOTOVOLTAIC POWER GENERATION SYSTEM FREE OF BYPASS DIODES

CROSS-REFERENCE TO RELATED APPLICATIONS

This application is a continuation-in-part of U.S. patent application Ser. No. 13/164,483, filed on Jun. 20, 2011 now U.S Pat. No. 8,736,108, and entitled "PHOTOVOLTAIC SYSTEM", which is a continuation-in-part of U.S. patent application Ser. No. 12/914,441, filed on Oct. 28, 2010 now U.S. Pat. No. 9,029,681, which is a continuation-in-part of U.S. patent application Ser. No. 11/933,458, filed on Nov. 1, 2007. This application is additionally a continuation-in-part of U.S. patent application Ser. No. 12/957,082, filed on Nov. 30, 2010 now U.S. Pat. No. 8,329,503, which is also a continuation-in-part of U.S. patent application Ser. No. 11/933, 458, filed on Nov. 1, 2007. The entireties of these applications are incorporated herein by reference.

STATEMENT OF GOVERNMENTAL INTEREST

This invention was developed under Contract DE-AC04-94AL85000 between Sandia Corporation and the U.S. Department of Energy. The U.S. Government has certain rights in this invention.

BACKGROUND

Environmental concerns pertaining to utilization of fossil fuels to generate electric power together with the non-renewable nature of such fossil fuels have increased demand for alternative energy sources. Exemplary electric power systems that utilize renewable energy resources include solar power systems, wind power systems, hydroelectric power systems, geothermal power systems, amongst others.

Conventional solar power systems, particularly those utilized to provide electric power to a residence, include solar panels that comprise a plurality of relatively large silicon photovoltaic cells (e.g., approximately six inches by six inches). For instance, a single solar panel can include approximately seventy two cells. The solar cells are manufactured to output a certain voltage (e.g., 0.6 volts for silicon cells) that is approximately constant regardless of an amount of solar radiation of particular wavelengths received at the solar cells, and are electrically connected in series within a solar panel, such that the solar panel produces approximately 40 volts. A typical residential solar system includes several solar panels (e.g., 5-10), and the panels are electrically connected in series, thereby resulting in several hundred cells being electrically connected in series that, collectively, output a voltage that is approximately equal to the sum of the voltages of the individual cells. It is to be noted, however, that when solar cells and panels are arranged electrically in series, the current must be equal across each of the cells in each of the solar panels.

Since the current of a photovoltaic cell is proportional to the light that is incident on the cell, if one cell of a series connection receives a low light level, the entire series connection has a low current. Thus, a typical solar power system configuration that includes several solar panels can have a severe current reduction (and power output reduction) when one cell or a portion of a cell has a low light level (e.g., due to shading). Oftentimes, when solar power systems are installed on residences or other buildings, trees or other obstructions may be nearby, and accordingly, shading of at least a portion of a module can occur frequently.

When shading occurs across a solar power system in a certain pattern, unless protective electric devices are in place, solar cells can be severely damaged. For instance, if a single solar cell is shaded by an obstruction, and all other cells in the solar power system are illuminated, then the single cell can be driven into reverse breakdown to support the current flow generated by the other cells. In current solar power installations, cell current is approximately five amperes, and silicon cells have a breakdown voltage of approximately 60 volts or more, depending on the cell design and manufacture techniques used to produce the cell. As breakdown is not a uniform process across a large cell, the relatively large current (five amperes) and the relatively large power (upwards of one hundred watts) can cause the device to malfunction in either a shorted or open state, causing improper operation and permanent damage to the cell, panel, and/or installation.

To prevent photovoltaic cells in solar power installations from being driven into reverse breakdown, bypass diodes are selectively positioned across the cells, thereby diverting current from cells with no photocurrent and preventing such cells from entering the breakdown region. Utilization of bypass diodes, however, consumes space in a solar power installation, is relatively expensive, and increases assembly time of solar panels. Furthermore, using bypass diodes can result in excessive power production loss, since each bypass diode normally protects one third of the cells in a panel (e.g., there are usually three bypass diodes in a panel). Therefore, if one cell is shaded, power production from all of the cells covered by the bypass diode will be lost.

SUMMARY

The following is a brief summary of subject matter that is described in greater detail herein. This summary is not intended to be limiting as to the scope of the claims.

Described herein are various technologies pertaining to photovoltaic power generation systems. More particularly, photovoltaic power generation systems that are free of any bypass diodes are described herein. In an exemplary embodiment, a photovoltaic power generation system can include at least one solar panel (also referred to as a module) that is composed of a plurality of photovoltaic sub-modules. Each photovoltaic sub-module can have an operating voltage of between 50 volts and 2000 volts, and multiple panels, therefore, can be arranged electrically in parallel. A nominal operating voltage of the solar panel is generally in a range between 200 volts and 500 volts, which is substantially optimal for conventional commercial inverters, because of the present-day regulatory limit of 600 volts in the United States, although the appended claims are not to be so limited by such regulatory limit. Further, in an exemplary embodiment, a photovoltaic sub-module can be less than 30 cm in width and less than 30 cm in length, although sub-modules of other sizes are contemplated. The arrangement of the photovoltaic sub-modules in parallel in the solar panel facilitates prevention of relatively large amounts of power being dissipated across one of such sub-modules when a particular sub-module or set of sub-modules is subjected to shading.

In another exemplary embodiment, each photovoltaic sub-module can comprise a plurality of groups of connected cells, wherein each group is configured to output between two volts and three volts, and wherein at least a subset of the groups are electrically connected in series. Each group of connected cells in a photovoltaic module can comprise a plurality of strings of photovoltaic cells, wherein the strings of photovoltaic cells are electrically connected in parallel. Each string of photovoltaic cells can include a plurality of photovoltaic cells that are electrically connected in series. This series/parallel/ series/parallel arrangement of photovoltaic cells in the solar panel facilitates prevention of relatively large amounts of current from being driven through any single photovoltaic cell when that cell happens to be shaded (while other cells in the solar panel are illuminated).

Pursuant to an example, the photovoltaic cells utilized to construct the solar panel can be microsystem-enabled photovoltaic cells that are configured to have an operating voltage of between 0.3 volts and 2.0 volts. Due to the relatively large number of cells that can be included in a given solar panel (e.g., over 30,000 cells), an amount of power that can be dissipated across a single cell, for nearly any potential shading pattern on the solar panel, will not cause damage to any given cell even if the cell is operating in reverse breakdown. Accordingly, the solar panel described herein need not include bypass diodes, which are conventionally employed to ensure that cells in a solar panel are not damaged when one or more of such cells are operating in reverse breakdown. This is because that, in the solar panel described herein, power dissipation across a single cell will not exceed a threshold that would damage the cell, even if such cell is in breakdown. That is, the cell can continue to operate in reverse breakdown indefinitely without sustaining damage, as an amount of current that can be directed to any cell in the solar panel is relatively small.

As mentioned above, the photovoltaic cells in the solar panel can be microsystem enabled cells. Pursuant to an example, such cells can be III-V cells, such as gallium arsenide cells, indium gallium phosphide cells, or indium gallium arsenide cells. In other exemplary embodiments, the photovoltaic cells can comprise silicon cells. In still other embodiments, the photovoltaic cells can comprise germanium photovoltaic cells. In accordance with yet another exemplary embodiment, the solar panel can comprise multi junction photovoltaic cells, wherein each multi junction photovoltaic cell can comprise a plurality of photovoltaic cells of different band gaps. Pursuant to an example, each photovoltaic cell in a multi-junction photovoltaic cell can be integrally connected electrically in series, such that the operating voltage of the multi junction photovoltaic cell is equivalent to the sum of the operating voltages of the respective microsystem enabled photovoltaic cells therein. In another exemplary embodiment, individual types of photovoltaic cells can be selectively arranged in series and parallel, wherein a number of photovoltaic cells electrically arranged in series can depend on a desired output or intermediate voltage.

Other aspects will be appreciated upon reading and understanding the attached figures and description.

DETAILED DESCRIPTION

Figure 1:
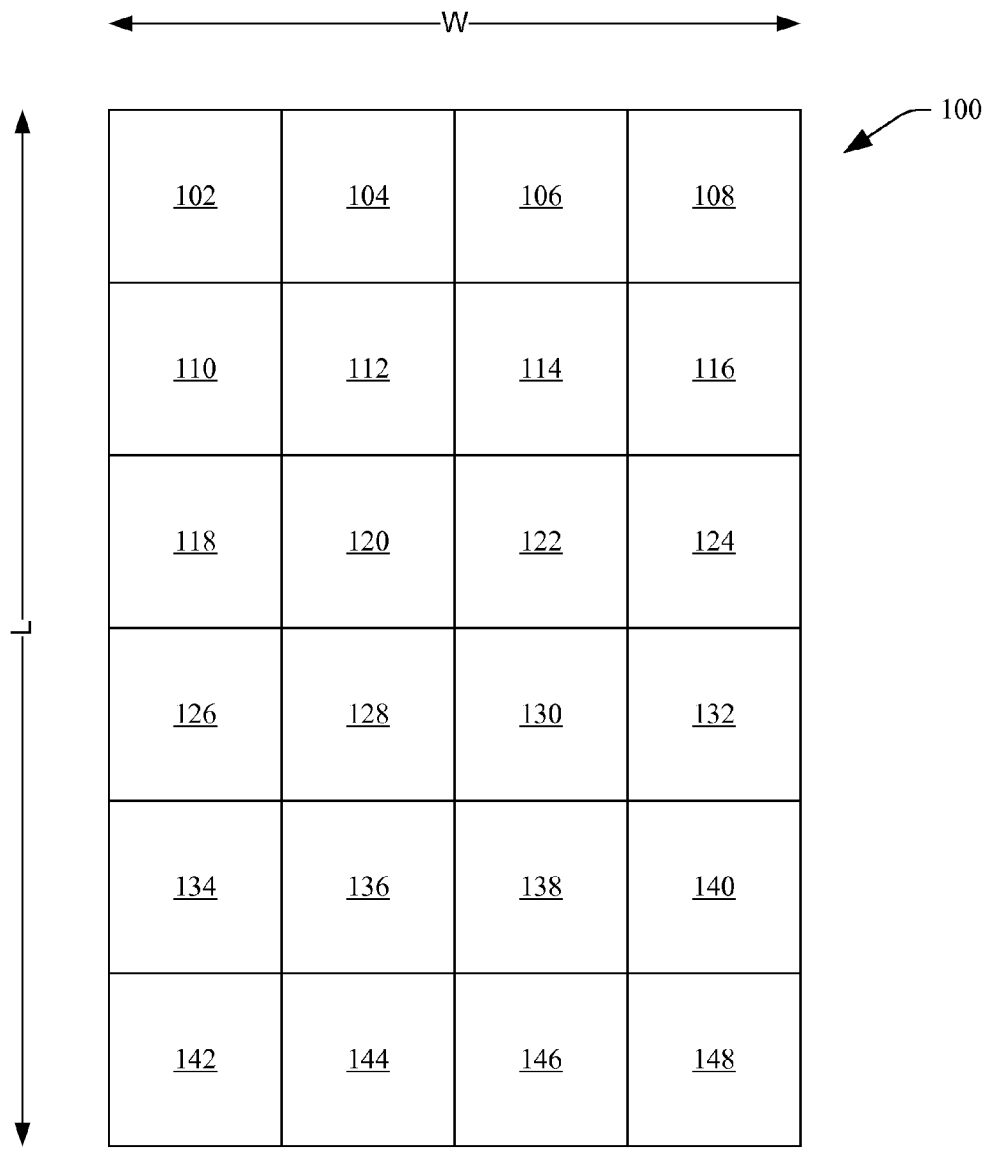
FIG. 1 illustrates an exemplary solar panel that comprises a plurality of photovoltaic sub-modules.

Various technologies pertaining to photovoltaic power generation systems will now be described with reference to the drawings, where like reference numerals represent like elements throughout. Additionally, as used herein, the term "exemplary" is intended to mean serving as an illustration or example of something, and is not intended to indicate a preference.

With reference now to FIG. 1, an exemplary solar panel 100 that is free of any bypass diodes is illustrated. In an exemplary embodiment, the solar panel 100 can be between one meter and two meters in length, and between one half meter and 1½ meters in width. Furthermore, the solar panel 100 can be configured to output between 200 volts and 300 volts, although in other embodiments the solar panel 100 can be configured to output up to 2000 volts. Pursuant to a particular example, the solar panel 100 can be configured to output 240 volts. As will be understood by one skilled in the art, however, an amount of voltage that can be output by the solar panel 100 can depend upon an application in which the solar panel 100 is employed and may be higher or lower than the 200-300 volt range.

The solar panel 100 comprises a plurality of photovoltaic sub-modules 102-148. While the solar panel 100 is shown as including 24 photovoltaic sub-modules, it is to be understood that the solar panel 100 may include more or fewer photovoltaic sub-modules, depending upon the application in which the solar panel 100 is employed, amount of space available upon which to install the solar panel 100, as well as the arrangement of the photovoltaic sub-modules 102-148 in the solar panel 100.

In an exemplary embodiment, the photovoltaic sub-modules 102-148 can be electrically connected in parallel with one another. Therefore, each of the photovoltaic sub-modules can output approximately the same voltage (e.g., between 200 and 600 volts). In another exemplary embodiment, rather than each of the photovoltaic sub-modules 102-148 being electrically connected in parallel, at least a subset of the photovoltaic sub-modules 102-148 can be connected to a power management integrated circuit, wherein such integrated circuit can be configured to output desired voltage and/or current levels resulting from the power that is produced from the subset of the photovoltaic sub-modules 102-148 electrically connected thereto. For instance, the solar panel 100 can include a single integrated circuit that is connected to each of the photovoltaic sub-modules 102-148 directly. The power management integrated circuit can then cause a final amount of power to be output by the solar panel 100 to be at a predefined, desired level (voltage and current). In another exemplary arrangement, subsets of photovoltaic sub-modules can be coupled in parallel, and such subsets can be connected to the power management integrated circuit. For instance, a first subset of photovoltaic sub-modules can include the photovoltaic sub-modules 102, 104, 106 and 108, which can be electrically connected in parallel. Similarly, a second subset of photovoltaic sub-modules can include the photovoltaic sub-modules 110, 112, 114 and 116, which can be electrically connected in parallel. The first subset of photovoltaic sub-modules and second subset of photovoltaic sub-modules may then be connected to the integrated circuit, which performs power management to cause a desired amount of power to be output by the solar panel 100. Other arrangements are also contemplated and are intended to fall under the scope of the hereto-appended claims.

The arrangement of at least some of the photovoltaic sub-modules 102-148 in the solar panel 100 in parallel effectively reduces the potential of any of the photovoltaic sub-modules (or cells therein) from being damaged when one or more photovoltaic cells in the photovoltaic sub-modules are operating in reverse breakdown. As at least some of the photovoltaic sub-modules 102-148 are electrically arranged in parallel, current matching between modules need not occur when at least one of the photovoltaic sub-modules 102-148 is shaded. This effectively reduces an amount of power that can be dissipated across any one of the photovoltaic sub-modules, thereby reducing risk of damage to a photovoltaic sub-module in the solar panel 100 when at least a portion of such sub-module is shaded. Accordingly, the solar panel 100 lacks a bypass diode.

Figure 2:
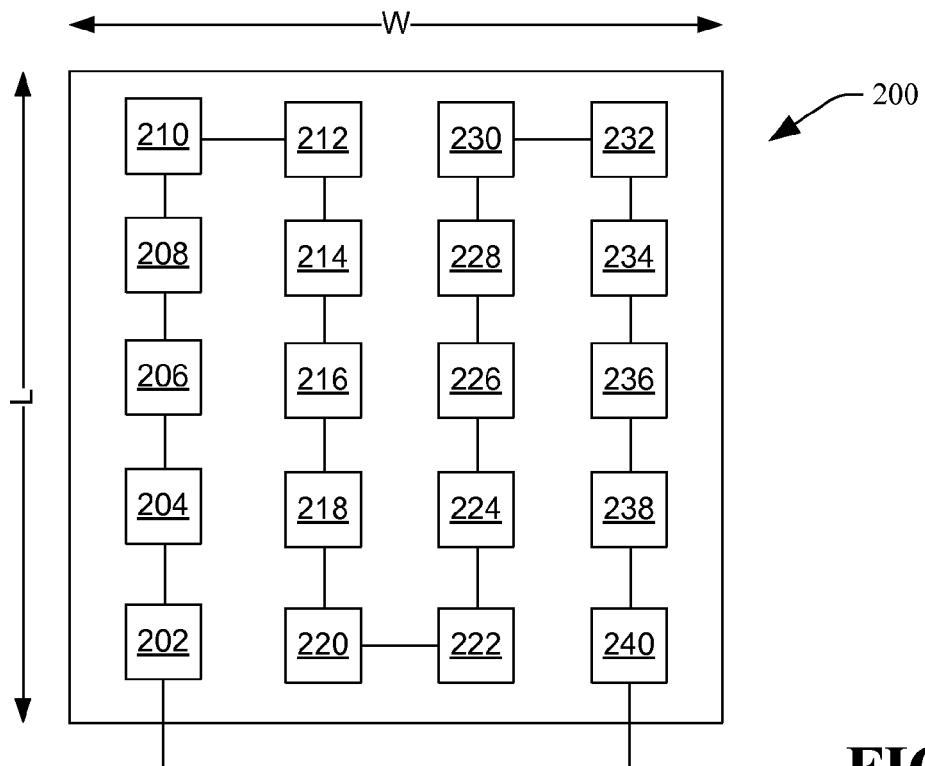
FIG. 2 illustrates an exemplary photovoltaic sub-module that comprises a plurality of photovoltaic groups of electrically connected photovoltaic cells.

Now referring to FIG. 2, an exemplary photovoltaic sub-module 200 that can be included in the solar panel 100 is illustrated. Pursuant to an example, size of the photovoltaic sub-module 200 can be between 10 centimeters and 30 centimeters in length, and between 10 centimeters and 30 centimeters in width. The photovoltaic sub-module 200 comprises a plurality of groups 202-240 of electrically connected photovoltaic cells, wherein the groups 202-240 are electrically connected in series. While the photovoltaic sub-module 200 is shown as including 20 groups, it is to be understood that a number and arrangement of groups in the photovoltaic sub-module 200 can depend upon a desired voltage output by the photovoltaic sub-module 200. Furthermore, while the photovoltaic sub-module 200 is shown as being a definable, physical sub-element of a solar panel, it is to be understood that a photovoltaic sub-module can be defined by a circuit that is employed to connect cells in a solar panel; both arrangements are intended to fall under the scope of the hereto-appended claims.

Pursuant to an example, the photovoltaic sub-module 200 can comprise approximately 100 groups, wherein each of the groups is configured to output a consistent voltage; for example, approximately 2.4 volts. In such example, the desired output of the photovoltaic sub-module 200 is approximately 240 volts. Furthermore, as will be shown in an example herein, some of the groups may be connected in parallel. For instance, the photovoltaic sub-module 200 can comprise a first plurality of groups that are connected in series and a second plurality of groups that are connected in series, wherein the first plurality of groups and the second plurality of groups are connected in parallel.

In the example noted above, each of the groups 202-240 is configured to output approximately 2.4 volts: Even if a subset of the groups 202-240 are shaded in the photovoltaic sub-module 200, because the voltage output thereby is relatively low and the current passing through the groups 202-240 is relatively low (on the order of milliamps), even if individual cells in the groups are operating in reverse breakdown, insufficient power is dissipated across the groups 202-240 to cause such groups 202-240 (or cells therein) to suffer damage. Accordingly, the photovoltaic sub-module 200 need not include any bypass diodes connected to any of the groups 202-240.

Figure 3:
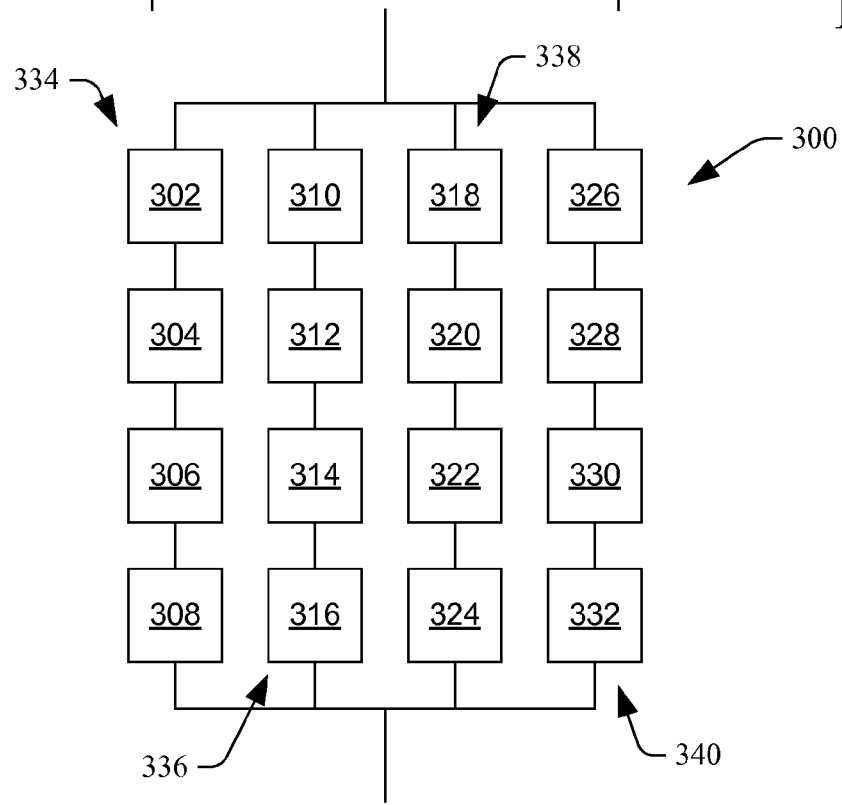
FIG. 3 illustrates an exemplary photovoltaic group of cells that comprises a plurality of strings of photovoltaic cells.

Now referring to FIG. 3, an exemplary group 300 that can be included as one of the groups 202-240 in the photovoltaic sub-module 200 is illustrated. The group 300 comprises a plurality of photovoltaic cells 302-332. Pursuant to an example, the photovoltaic cells 302-332 can be microsystem enable photovoltaic cells that are relatively thin (1.0-50 micrometers thick), small (50 micrometers-10 millimeters laterally) photovoltaic cells that are built using microfabrication concepts. In another example, a photovoltaic cell can be no larger than two centimeters in length by two centimeters in width. For instance, the following references, which are incorporated herein by reference, describe the building of photovoltaic modules that comprise numerous photovoltaic cells using microfabrication techniques: Nielson, et al., "Microscale C-SI (C) PV Cells for Low-Cost Power", $34^{th}$ IEEE Photovoltaic Specialist Conference, Jun. 7-10 2009, Philadelphia, Pa., 978-1-4244-2950/90, and Nielson, et al., "Microscale PV Cells for Concentrated PV Applications," $24^{th}$ European Photovoltaic Solar Energy Conference, Sep. 21-25, 2009, Hamburg, Germany 3-936338-25-6. In summary, such references described one sun and concentrating systems with integrated micro-optical lenses, and further describe relatively thin cells that have been fabricated using epitaxial lift-off in Silicon (Si) and Gallium Arsenide (GaAs) with efficiencies exceeding 10%.

Accordingly, the photovoltaic cells 302-332 can be or include Si cells, GaAs cells, and/or Indium Gallium Phosphorous (Phosphide) (InGaP) cells. Therefore, it is to be understood that at least one of the photovoltaic cells 302-332 can be a III-V photovoltaic cell. Additionally or alternatively, the photovoltaic cells 302-332 can include at least one Germanium (Ge) photovoltaic cell. Still further, the photovoltaic cells 302-332 cart be, or may be included in, multi-junction cells that include layers of differing types of photovoltaic cells with differing band gaps. Heterogeneously integrating (e.g., vertically stacking) different cell types for dielectric layers therebetween, can yield high performance multi-junction cells, where a designer of a photovoltaic panel is free from lattice matching and series connected constraints of monolithic cells.

In an exemplary embodiment, each of the photovoltaic cells 302-332 can be a multi-junction cell wherein, for each multi-junction cell, layers are integrally connected. This effectively creates a string of photovoltaic cells electrically connected in series in a relatively small amount of space. In another exemplary embodiment, as will be shown herein, cells in a multi-junction cell may not be integrally connected. In yet another exemplary embodiment, the photovoltaic cells 302-332 can be of the same type (silicon). Other arrangements of photovoltaic cells are also contemplated.

In an exemplary embodiment, the submodule 300 can comprise a first string of photovoltaic cells 334, a second string or photovoltaic cells 336, a third string of photovoltaic cells 338, and a fourth string of photovoltaic cells 340. The first string of photovoltaic cells 334 comprises the photovoltaic cells 302-308 electrically connected in series. Similarly, the second string of photovoltaic cells 336 comprises photovoltaic cells 310-316 electrically connected in series. The third string of photovoltaic cells 338 comprises the photovoltaic cells 318-324 electrically connected in series, and the fourth string of photovoltaic cells 340 comprises the photovoltaic cells 326-332 electrically connected in series. The first string of photovoltaic cells 334, the second string of photovoltaic cells 336, the third string of photovoltaic cells 338, and the fourth string of photovoltaic cells 340 are electrically connected in parallel.

As will be understood by one skilled in the art, different types of photovoltaic cells have different operating voltages. For instance, if the photovoltaic cells 302-332 are Ge cells, the operating voltage may be approximately 0.3 volts. If the photovoltaic cells 302-332 are Si cells, then the operating voltage may be approximately 0.6 volts. If the photovoltaic cells 302-332 are GaAs cells, then the operating voltage may be approximately 0.9 volts, and if the photovoltaic cells 302-332 are InGaP cells, then the operating voltage may be approximately 1.3 volts. Pursuant to an example, the photovoltaic cells 302-332 can be Si cells. In such an example, each of the strings of photovoltaic cells 334-340 outputs approximately 2.4 volts (a common voltage), and therefore the output of the group 300 is approximately 2.4 volts. In this case, strings 334, 336, 338, and 340 have different numbers of cells for the different cell types, approximating the common voltage. For example, in an exemplary embodiment, the first string of photovoltaic cells 334 can include eight Germanium cells (8×0.3=2.4), the second string of photovoltaic cells 336 can include four Silicon cells (4×0.6=2.4), the third string of photovoltaic cells 338 can include three GaAs cells (3×0.9=2.7), and the fourth string of photovoltaic cells 340 can include two InGaP cells (2×1.3=2.6). The slight voltage mismatch is tolerable, and if desired, a larger number of cells and a higher voltage can be used to provide more precise voltage matching. In another embodiment described earlier, power management circuitry can be used to independently boost the voltages generated by the series connections of different cell types to a common voltage. If the desired output of the solar panel 100 is approximately 240 volts, then the photovoltaic sub-module 200 can include one hundred of the groups 300 electrically connected in series. Therefore, each sub-module 102-148 in the solar panel 100 outputs approximately 240 volts, and the output of the solar panel 100 is thus approximately 240 volts.

Using this example, the solar panel 100 includes 38,400 cells. When an entirety of the solar panel 100 is illuminated, the photovoltaic cells 302-332 in each of the groups generate 4 milliwatts of electric power. For microsystem-enabled photovoltaic cells, electric power on the order of 100 milliwatts across a single cell, even if such cell is operating in reverse breakdown, is not damaging. Electric power over 100 milliwatts is very unlikely to occur across a single cell due to the selective arrangement of photovoltaic cells, submodules and modules in a solar panel in series/parallel/series/parallel as described herein. Given such exemplary arrangement, and utilizing microsystem-enable photovoltaic cells, it is readily apparent that a solar panel that is composed of photovoltaic cells described above can be free of any bypass diodes, since individual cells are not likely to be damaged even when a portion of the solar panel is subject to shading.

Figure 4:
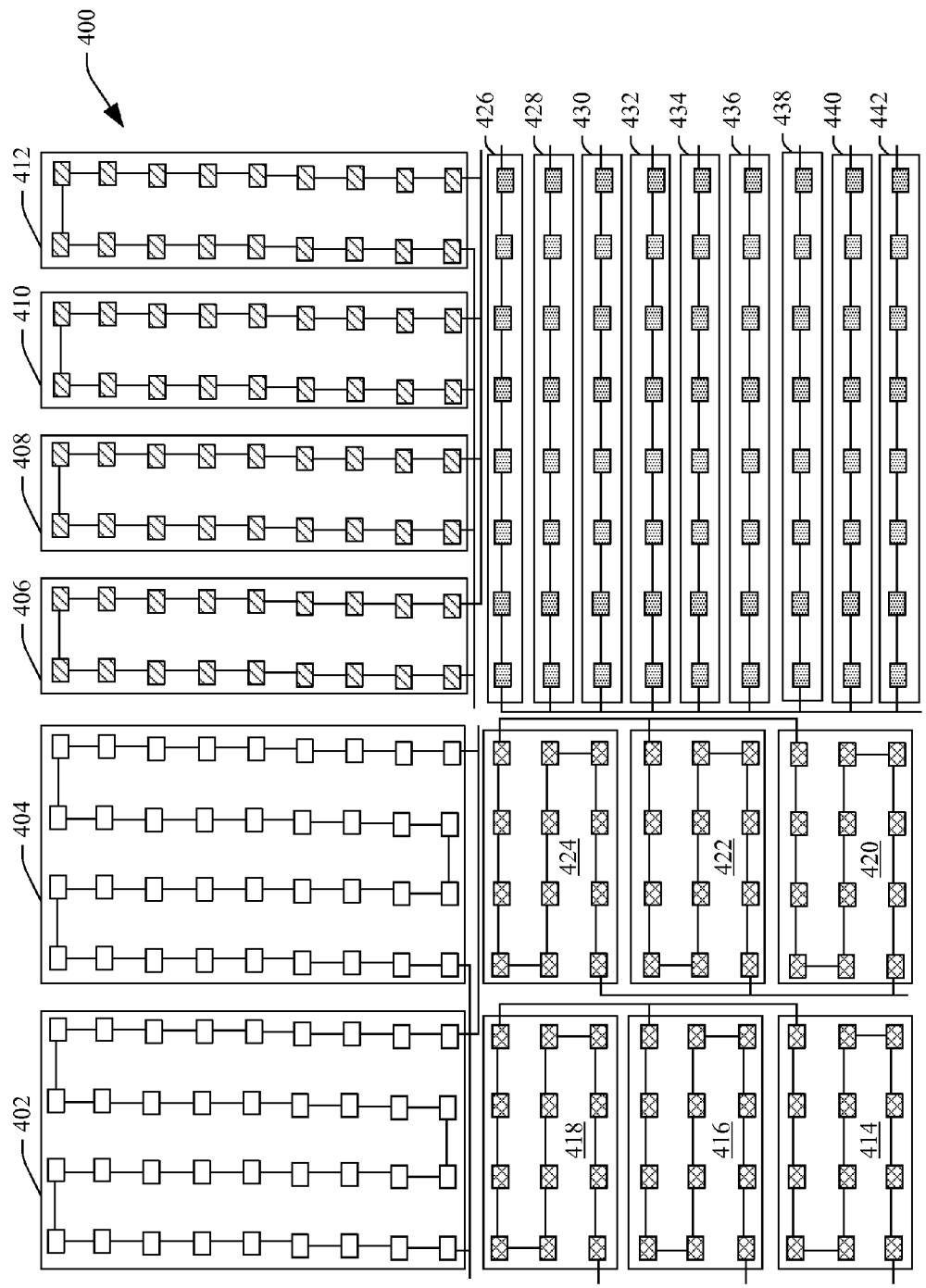
FIG. 4 illustrates another exemplary solar panel that is composed of a plurality of photovoltaic sub-modules, which are themselves composed of respective pluralities of groups of electrically connected photovoltaic cells.

Now referring to FIG. 4, an exemplary photovoltaic sub-module 400 that can be included as one of the photovoltaic sub-modules 102-148 in the solar panel 100 is illustrated. Pursuant to an example, the photovoltaic sub-module 400 can comprise a plurality of multi junction photovoltaic cells, such that each multi junction photovoltaic cell comprises a plurality of photovoltaic cells. As discussed above, each multi junction photovoltaic cell can comprise a Si photovoltaic cell and a III-V photovoltaic cell. In a more specific example, each multi junction photovoltaic cell can comprise a Ge photovoltaic cell, a Si photovoltaic cell, a GaAs photovoltaic cell and an InGaP photovoltaic cell.

The exemplary photovoltaic sub-module 400 comprises 72 multi junction photovoltaic cells, wherein each of the multi-junction photovoltaic cells comprises a Ge cell, an Si cell, a GaAs cell, and an InGaP cell. These different cells are shown as laid out adjacent to one another; however, such layout is for purposes of explanation. As indicated above, the cells in the multi junction cells are stacked on top of one another. In another exemplary embodiment, cells can be placed in a side-by-side configuration (e.g., if spectrum spreading optics are used).

The photovoltaic module 400 comprises different numbers of each cell type connected in series (to create a string) to arrive at similar intermediate (higher) voltage. These strings can be connected in parallel to effectively add currents. In an example, a desired intermediate voltage output by the photovoltaic module 400 can be approximately 10 volts. As discussed above, a Ge cell may have an operating voltage of approximately 0.3 volts, an Si cell may have an operating voltage of approximately 0.6 volts, a GaAs cell may have an operating voltage of approximately 0.9 volts, and an InGaP cell may have an operating voltage of approximately 1.3 V. Therefore, the photovoltaic sub-module 400 can comprise a first string of Ge cells 402 and a second string of Ge cells 404 that each comprises 36 cells electrically connected in series. Accordingly, each of the first string of Ge cells 402 and the second string of Ge cells 404 outputs approximately 10.8 V.

The exemplary photovoltaic sub-module 400 further comprises a first string of Si cells 406, a second string of Si cells 408, a third string of Si cells 410 and a fourth string of Si cells 412. Each of the strings of Si cells 406-412 can comprise 18 cells electrically connected in series, resulting in each string outputting approximately 10.8 volts.

The sub-module 400 can additionally comprise a first string of GaAs cells 414, a second string of GaAs cells 416, a third string of GaAs cells 418, a fourth string of GaAs cells 420, a fifth string of GaAs cells 422, and a sixth string of GaAs cells 424. Each of the strings of GaAs cells 414-424 can comprise 12 cells electrically connected in series, resulting in each string of GaAs cells outputting approximately 10.8 volts.

Further, the sub-module 400 can also comprise a first string of InGaP cells 426, a second string of InGaP cells 428, a third string of InGaP cells 430, a fourth string of InGaP cells 432, a fifth string of InGaP cells 434, a sixth string of InGaP cells 436, a seventh string of InGaP cells 438, an eighth string of InGaP cells 440, and a ninth string of InGaP cells 442. Each of the strings of InGaP cells 426-442 can comprise eight cells electrically connected in series resulting in each string of InGaP cells outputting approximately 10.4 volts.

From the above, it can be ascertained that an intermediate operating voltage for each string of cells can be approximately 10 volts. It can further be ascertained that voltages output by strings of different cell types are not identical, and thus the voltage output by the sub-module 400 will be the lowest voltage output by the strings of cells.

Because only one type of cell is initially connected in series, power output from other cells in the sub-module 400 is relatively unaffected by spectral shifts that cause a decrease in output of one type of cell versus another. For example, a 10% reduction of current from one cell type yields a reduction in array current from 1 to 4.3% depending upon which cell has reduced solar input. Thus, the sub-module 400 is less susceptible to output power reductions from spectral shifts that affect response of cell types in an unequal manner when compared to conventional photovoltaic modules:

With reference again to FIG. 1, the solar panel 100, while not shown, can be associated with an inverter that transforms the voltage output by the solar panel 100 from DC to AC at a phase desired by a consumer of electric power produced by such solar panel 100. Further, while not shown, the solar panel 100 can comprise micro-concentrating optics that are configured to concentrate light from the sun onto the photovoltaic cells therein. In another exemplary embodiment, rather than undertaking precise voltage matching between cell types, microelectronics can be employed to cause intermediate voltages to be at desired levels (voltages output by each of the modules 102-148). Therefore, a photovoltaic submodule or group can comprise one or more DC to DC converters (with micropower tracking electronics) to cause intermediate output voltages to be approximately equivalent and dynamically adjustable. Moreover, a photovoltaic group can comprise micro-inverters that transform DC voltage output by a cell or arrangement of cells into AC voltage. As the individual cells in the solar panel 100 are relatively small in size, there is sufficient room between cells, sub-modules, or groups for adding various microelectronic devices for boost conversion and power tracking.

Figure 5:
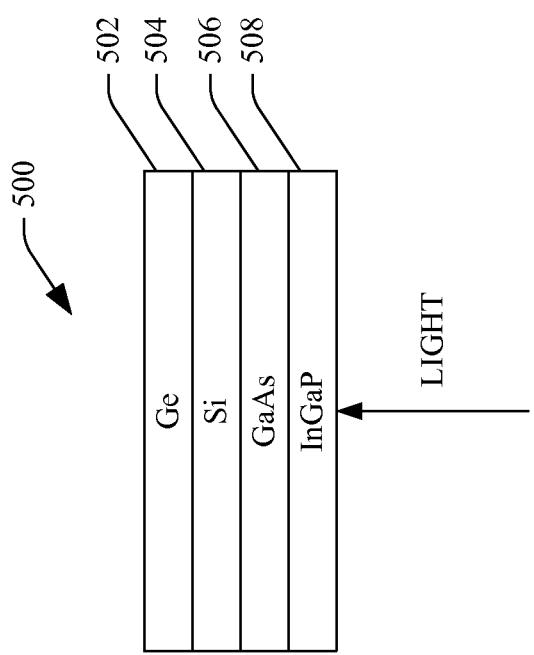
FIG. 5 illustrates an exemplary multi-junction microsystem enabled photovoltaic cell.

With reference now to FIG. 5, a cutaway view of an exemplary heterogeneously (non-monolithic) integrated multi-junction photovoltaic cell 500 is illustrated. The multi-junction photovoltaic cell 500 comprises a plurality of photovoltaic cells: an InGaP cell 508 initially receives light from the sun; a GaAs cell 506 is immediately adjacent to the InGaP cell 508; an Si cell 504 is immediately adjacent to the GaAs cell 506; and a Ge cell 502 is immediately adjacent to the Si cell 504. It is to be understood that other arrangements are contemplated by the inventors and are intended to fall under the scope of the hereto appended claims.

Exemplary embodiments where the solar panel 100 is beneficially employed include any installation where at least partial shading is possible. For example, a rooftop of a building with trees nearby; areas with intermittent cloud cover, areas proximate to air traffic, and the like. Additionally, features described herein are beneficial in installations where the solar panel 100, portions thereof, or an entire installation are flexible, curved, conformed, or otherwise non-planar in such a manner such that at least a portion of the solar panel 100 is always subject to shading. In such an installation, the solar panel can output desired voltages without the solar panel 100 including bypass diodes.

Figure 6:
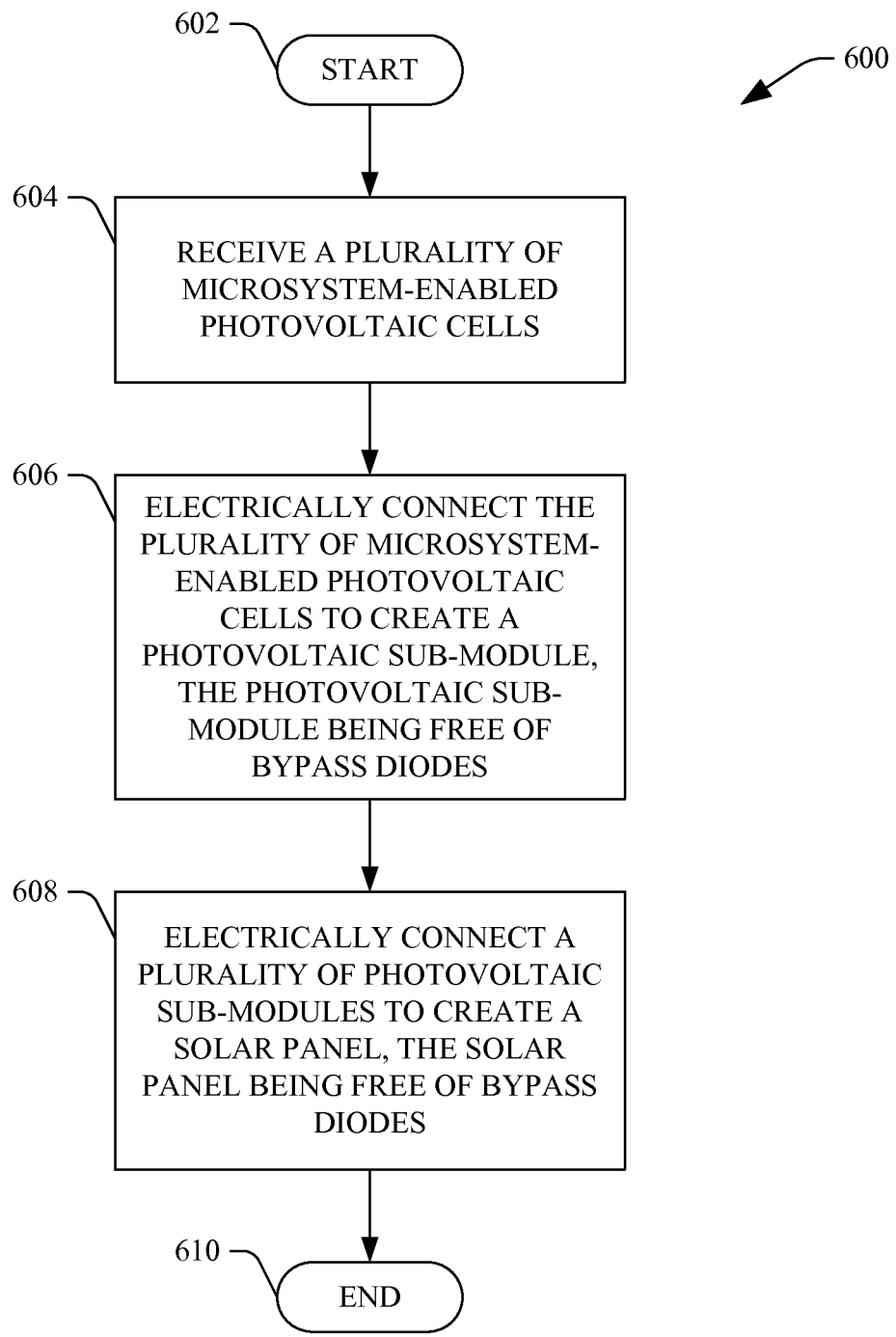
FIG. 6 illustrates an exemplary methodology for constructing a solar panel that does not include bypass diodes.
Figure 7:
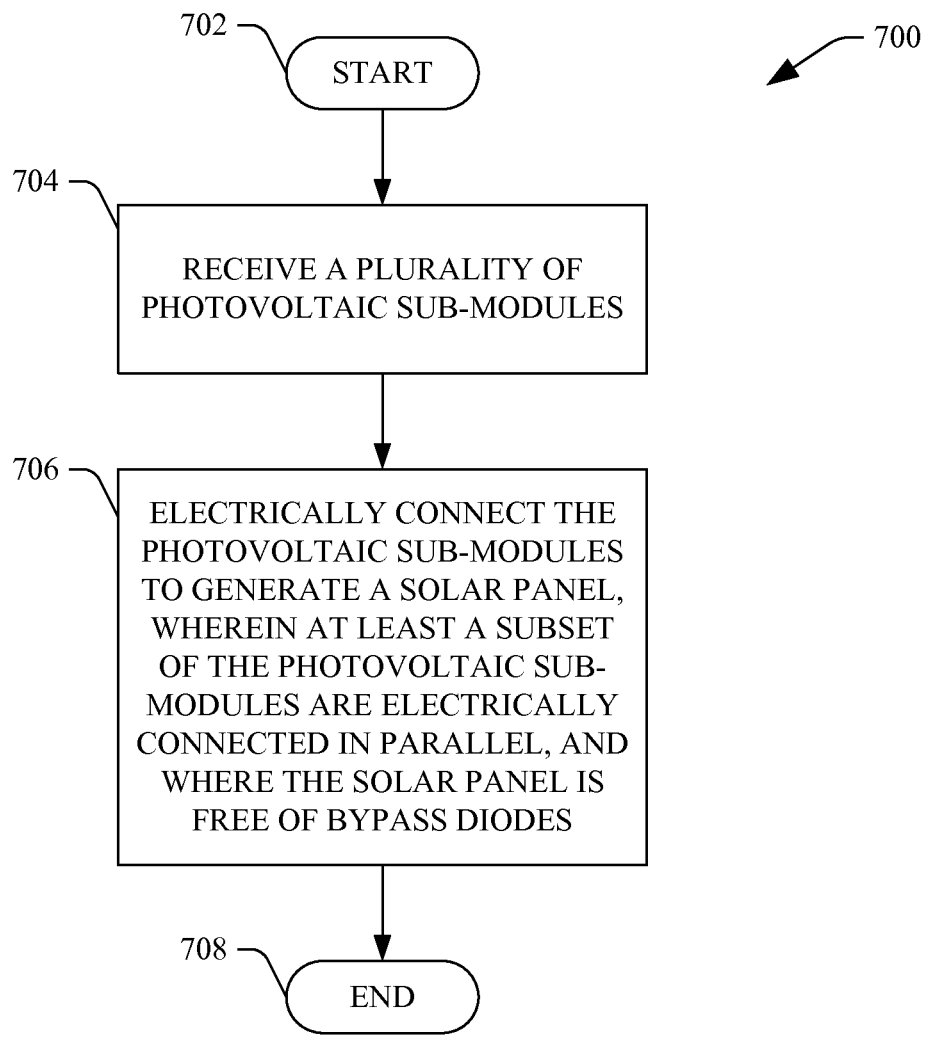
FIG. 7 illustrates an exemplary methodology for constructing a solar panel that fails to include a bypass diode.

With reference now to FIGS. 6-7, various exemplary methodologies are illustrated and described. While the methodologies are described as being a series of acts that are performed in a sequence, it is to be understood that the methodologies are not limited by the order of the sequence. For instance, some acts may occur in a different order than what is described herein. In addition, an act may occur concurrently with another act. Furthermore, in some instances, not all acts may be required to implement a methodology described herein.

Now referring to FIG. 6, an exemplary methodology 600 that facilitates creating a solar panel that is free of bypass diodes is illustrated. The methodology 600 starts at 602, and at 604 a plurality of microsystem-enabled photovoltaic cells are received. In an exemplary embodiment, the microsystem-enabled photovoltaic cells can have both positive and negative contacts on a backside thereof.

At 606, the plurality of microsystem-enabled photovoltaic cells can be electrically connected to create a photovoltaic sub-module, wherein the photovoltaic sub-module is free of bypass diodes. As discussed above, the relatively small amount of current that travels through the microsystem-enabled photovoltaic cells ensures that any individual photovoltaic cell is not damaged when operating in reverse breakdown when such cell is subjected to shading.

At 608, a plurality of photovoltaic sub-modules are electrically connected to create a solar panel. Because the photovoltaic sub-modules are composed of the microsystem-enabled photovoltaic cells, the solar panel can be free of bypass diodes. The solar panel however, in an exemplary embodiment, can include a power management integrated circuit that is electrically connected to photovoltaic sub-modules in the solar panel such that the power management integrated circuit can output electric power based, at least in part, upon voltages output by respective photovoltaic sub-modules. In another embodiment, power management integrated circuits can be placed in connection with groups, such that strings of photovoltaic cells are electrically connected to the power management integrated circuit, and the output of a sub-module is based upon voltages output by the respective groups that are connected to the integrated circuit. The methodology 600 completes at 610.

Now referring to FIG. 7, another exemplary methodology 700 for creating a solar panel that lacks bypass diodes is illustrated. The methodology 700 starts at 702, and at 704 a plurality of photovoltaic sub-modules are received.

At 706, the photovoltaic sub-modules are electrically connected to generate a solar panel, wherein at least a subset of the photovoltaic sub-modules are electrically connected in parallel, and wherein the solar panel is free of bypass diodes. The methodology 700 completes at 708.

It is noted that several examples have been provided for purposes of explanation. These examples are not to be construed as limiting the hereto-appended claims. Additionally, it may be recognized that the examples provided herein may be permutated while still falling under the scope of the claims.

What is claimed is:

1. Apparatus comprising at least one photovoltaic sub-module, wherein:
    the at least one photovoltaic sub-module is free of any bypass diodes;
    the at least one photovoltaic sub-module comprises a first, a second, a third, and a fourth series-connected string of microsystem-enabled photovoltaic cells, each said cell having a size no greater than two centimeters in height and two centimeters in width;
    the first and second said strings are connected to each other in parallel, thereby to form a first group;
    the third and fourth said strings are connected to each other in parallel, thereby to form a second group; and
    the first group is electrically coupled in series with the second group.

2. The apparatus of claim 1 outputting between 500 volts and 2000 volts.

3. The apparatus of claim 1 being less than 30 centimeters in length and less than 30 centimeters in width.

4. The apparatus of claim 1, wherein at least one photovoltaic cell from amongst the plurality of photovoltaic cells has both positive and negative electrical contacts on a back side of the at least one photovoltaic cell.

5. The apparatus of claim 1, wherein a plurality of microsystem-enabled cells comprise at least one of InGaP cells or InGaAs cells.

6. The apparatus of claim 1, wherein a plurality of microsystem-enabled cells comprise GaAs cells.

7. The apparatus of claim 1, wherein a plurality of microsystem-enabled cells comprise at least one of Ge cells and Si cells.

8. The apparatus of claim 1, wherein a plurality of multi junction cells respectively comprise the plurality of photovoltaic cells.

9. The apparatus of claim 1, wherein the apparatus is a solar panel.

10. The apparatus of claim 9, wherein the solar panel is free of any bypass diodes.

11. Apparatus comprising at least one photovoltaic sub-module, wherein:
    the at least one photovoltaic sub-module is free of any bypass diodes;
    the at least one photovoltaic sub-module comprises a first and a second series-connected string of microsystem-enabled photovoltaic cells, each said cell having a size no greater than two centimeters in height and two centimeters in width; and the at least one photovoltaic sub-module further comprises a power management integrated circuit that is electrically connected to the first string of microsystem-enabled photovoltaic cells and the second string of microsystem-enabled photovoltaic cells, wherein the power management integrated circuit outputs a predefined amount of electric power based at least in part upon voltages output by the first string of microsystem-enabled photovoltaic cells and the second string of microsystem-enabled photovoltaic cells and is dynamically adjustable based on external operating conditions or system operation commands.

12. A solar panel comprising one or more photovoltaic sub-modules, wherein:

each photovoltaic sub-module comprises a plurality of microsystem-enabled photovoltaic cells in electrical connection with one another;

each microsystem-enabled photovoltaic cell is of a size no greater than two centimeters in height and two centimeters in width;

the solar panel is free of any bypass diodes; and the solar panel is non-planar.

13. A solar panel comprising:

a first photovoltaic sub-module, the first photovoltaic sub-module comprising a first plurality of photovoltaic cells; and a second photovoltaic sub-module, the second photovoltaic sub-module comprising a second plurality of photovoltaic cells, wherein the first photovoltaic sub-module and the second photovoltaic sub-module are electrically connected in parallel, and wherein the solar panel is free of any bypass diodes, wherein:

each of the first and second photovoltaic sub-modules comprises a string of series-connected photovoltaic cells;

the solar panel has an output voltage that is a sum of individual cell voltages added together by series connection; and the sum of individual cell voltages provides a total output voltage in the range from 200 volts to 600 volts.

14. The solar panel of claim 13, wherein the first photovoltaic sub-module is less than 30 centimeters in length and less than 30 centimeters in height.

15. The solar panel of claim 13, wherein the first photovoltaic sub-module comprises:

a first group of photovoltaic cells, wherein the first group of photovoltaic cells comprises:

a first string of microsystem-enabled photovoltaic cells; and a second string of microsystem-enabled photovoltaic cells, wherein cells in the first string of microsystem-enabled photovoltaic cells are electrically connected in series, wherein cells in the second string of microsystem-enabled photovoltaic cells are electrically connected in series, and wherein the first string of microsystem-enabled photovoltaic cells and the second string of microsystem-enabled photovoltaic cells are electrically connected in parallel.

16. The solar panel of claim 15, wherein a plurality of multi junction photovoltaic cells comprises the first string of microsystem-enabled photovoltaic cells and the second string of microsystem-enabled photovoltaic cells.

* * * * *